(12) United States Patent
Embar et al.

(10) Patent No.: US 8,952,758 B2
(45) Date of Patent: Feb. 10, 2015

(54) AMPLIFIER USING NONLINEAR DRIVERS

(71) Applicants: Srinidhi R. Embar, Chandler, AZ (US); Abdulrhman M. S Ahmed, Gilbert, AZ (US); Joseph Staudinger, Gilbert, AZ (US)

(72) Inventors: Srinidhi R. Embar, Chandler, AZ (US); Abdulrhman M. S Ahmed, Gilbert, AZ (US); Joseph Staudinger, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 108 days.

(21) Appl. No.: 13/868,777

(22) Filed: Apr. 23, 2013

(65) Prior Publication Data

US 2014/0312975 A1  Oct. 23, 2014

(51) Int. Cl.
*H03F 3/68* (2006.01)
(52) U.S. Cl.
USPC ............... 330/295; 330/124 R; 330/149
(58) Field of Classification Search
USPC .................................. 330/295, 124 R, 149
IPC .............................................. H03F 3/68
See application file for complete search history.

(56) References Cited

U.S. PATENT DOCUMENTS

| 6,940,349 | B2 * | 9/2005 | Hellberg ............... 330/124 R |
| 7,295,064 | B2 | 11/2007 | Shiikuma et al. |
| 7,362,170 | B2 | 4/2008 | Louis |
| 7,541,866 | B2 * | 6/2009 | Bowles et al. ........... 330/124 R |
| 7,756,494 | B2 * | 7/2010 | Fujioka et al. ............ 455/127.1 |
| 8,098,092 | B2 * | 1/2012 | Miyashita et al. ........ 330/124 R |
| 8,442,460 | B2 * | 5/2013 | Fonden et al. ............ 455/114.2 |
| 2008/0122542 | A1 * | 5/2008 | Bowles et al. ............... 330/277 |

* cited by examiner

*Primary Examiner* — Patricia Nguyen

(57) ABSTRACT

A device includes a Doherty amplifier having a main path and a peaking path. The Doherty amplifier includes a main amplifier configured to amplify a signal received from the main path and a peaking amplifier configured to amplify a signal received from the peaking path when the signal received from the peaking path exceeds a predetermined threshold. The device includes a first driver amplifier connected to the main path of the Doherty amplifier. The first driver amplifier is configured to exhibit an amplitude and phase distortion characteristic that is an inverse of an amplitude and phase distortion characteristic of the main amplifier. The device includes a second driver amplifier connected to the peaking path of the Doherty amplifier. The second driver amplifier is configured to exhibit an amplitude and phase distortion characteristic that is an inverse of an amplitude and phase distortion characteristic of the peaking amplifier.

20 Claims, 7 Drawing Sheets

AMPLIFIER USING NONLINEAR DRIVERS

FIELD OF THE INVENTION

Embodiments of the inventive subject matter relate to an amplifier in general and more specifically to an amplifier including non-linear drivers and having improved linearity and efficiency.

BACKGROUND OF THE INVENTION

Doherty amplifiers are amplifiers commonly used in wireless communication systems. Today, for example, Doherty amplifiers are used increasingly in base stations that enable the operation of wireless communications networks. Doherty amplifiers are suitable for use in such applications because the amplifiers include separate amplification paths, typically a main or carrier path and a peaking path. The two paths are configured to operate at different classes. More particularly, the main amplification path typically operates in a class AB mode and the peaking amplification path is biased such that it operates in a class C mode. This enables improved power-added efficiency and linearity of the amplifier, as compared to a balanced amplifier, at the power levels commonly encountered in wireless communications applications.

Although the Doherty amplifier architecture presents several benefits over other amplifier configurations, a Doherty amplifier must often be augmented with some form of linearity enhancement when used in high-power base station transmitter systems. In many cases, digital predistortion (DPD) is utilized to improve the linear performance of the amplifier for wireless infrastructure applications. Unfortunately, the utilization of DPD correction techniques requires additional hardware and software, consuming additional power and thereby lowering transmitter efficiency. Additionally, the efficacy of DPD correction is affected by non-linear mechanisms occurring within the power amplifier itself. These non-linear mechanisms can be difficult to control, particularly in a lineup amplifier configuration that includes a dual-path Doherty architecture.

BRIEF DESCRIPTION OF THE DRAWINGS

The accompanying figures, in which like reference numerals refer to identical or functionally similar elements throughout the separate views and which together with the detailed description below are incorporated in and form part of the specification, serve to further illustrate various embodiments and to explain various principles and advantages all in accordance with the present inventive subject matter.

DETAILED DESCRIPTION

Figure 1:
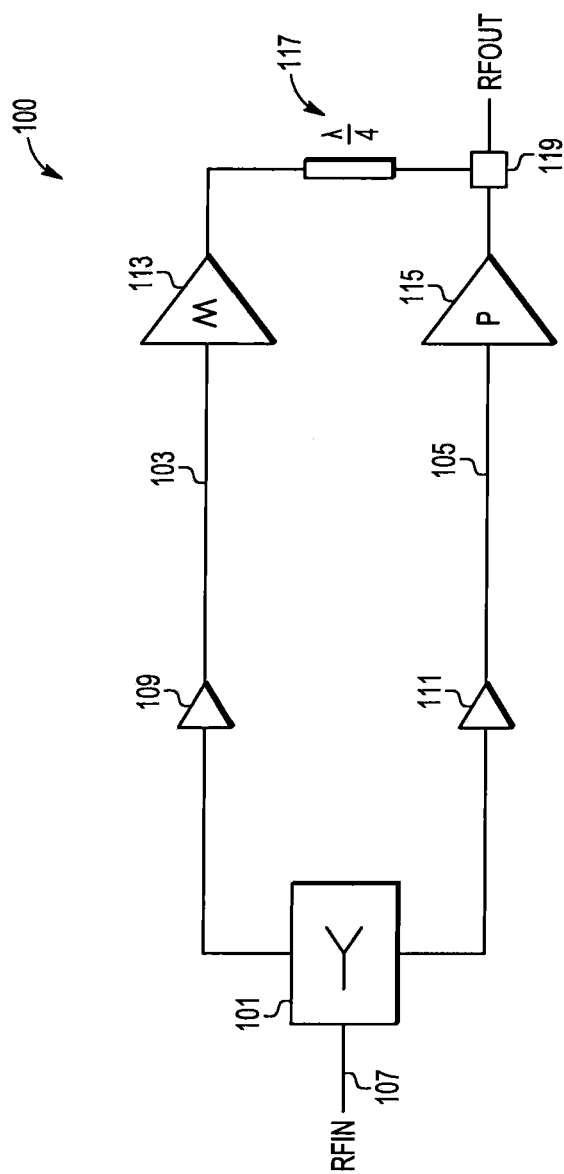
FIG. 1 shows an example Doherty amplifier lineup including a main and a peaking path, each driven by an input driver amplifier.

In overview, the present disclosure describes embodiments of the inventive subject matter relating to an amplifier in general and more specifically to an amplifier including non-linear drivers and having improved linearity and efficiency.

In the present disclosure, embodiments of the system are described in conjunction with a Doherty amplifier, though it should be appreciated that in the present disclosure the Doherty amplifier may be replaced by an alternative dual-path amplifier.

The present disclosure is provided to further explain in an enabling fashion the best modes, at the time of the application, of making and using various embodiments in accordance with the present disclosure. The disclosure is further offered to enhance an understanding and appreciation for the inventive principles and advantages thereof, rather than to limit in any manner the scope of the invention.

It is further understood that the use of relational terms, if any, such as first and second, top and bottom, and the like are used solely to distinguish one entity or action from another without necessarily requiring or implying any actual such relationship or order between such entities or actions.

Much of the inventive functionality and many of the inventive principles can be implemented with or in integrated circuits (ICs) including possibly application-specific ICs or ICs with integrated processing or control or other structures. It is expected that one of ordinary skill, when guided by the concepts and principles disclosed herein, will be readily capable of generating such ICs and structures with minimal experimentation. Therefore, in the interest of brevity and minimization of any risk of obscuring the principles and concepts according to below-described embodiments of the present invention, further discussion of such structures and ICs, if any, will be limited to the essentials with respect to the principles and concepts of the various embodiments.

Doherty amplifiers are used in a number of wireless applications, as the amplifiers enable high efficiency over a wide output power range and can achieve a desired linearity using various linearization schemes. In many implementations, Doherty amplifiers include two amplifiers, a first main (or carrier) amplifier, and a second peaking amplifier. In a symmetric Doherty amplifier, the main and peaking amplifiers are the same size. Symmetric Doherty amplifiers are commonly used, but asymmetric Doherty amplifiers that employ a peaking amplifier that is larger than the main amplifier offer the potential for additional efficiency improvements.

In a Doherty amplifier, an input signal is split at an input or power splitter between the main and peaking amplification path or circuit. The split signals are then separately amplified by the main and peaking amplifiers of the Doherty amplifier and combined at an output stage. When combining the outputs of the main and peaking amplifiers, it may be desired to make minor adjustments in the phase and amplitude or attenuation of the Doherty device's input splitter to provide optimal balancing between the outputs of each path. To facilitate this adjustment, a Doherty amplifier may include an adjustable power divider or splitter that can be used to fine-tune the configuration of the input signals to both the main and peaking amplifiers.

In a Doherty configuration, the main and peaking amplifiers tend to operate in a non-linear fashion and, as such, Doherty amplifiers often require the incorporation of linearizing elements. In wireless communication applications, for example, Doherty amplifiers are sometimes augmented with some form of linearity enhancement, such as digital predistortion (DPD), such that the overall transmitter is linearized and complies with spectral emission requirements. Consequently, linearity enhancement methods improve the linearity of the amplifier while the amplifier operates in an efficiency mode. However, the efficacy of DPD correction is affected by non-linear mechanisms occurring within the amplifier. In general the DPD capabilities strongly depend on the nonlinearity of the amplifier, which means large AM/AM and AM/PM distortions cause degradation in DPD performance.

In some cases, the Doherty amplifiers on the main and peaking paths are each preceded by a driver amplifier used to boost the input signal to the main and peaking paths. Conventionally, these driver amplifiers are configured to operate with a linear response, thereby reducing the degree to which the driver amplifiers affect the linearity of the overall device. However, due to the high current drawn by these driver amplifiers, the overall efficiency of the Doherty amplifier is degraded.

In contrast to conventional Doherty amplifier configurations, the present disclosure provides a Doherty amplifier lineup that includes driver amplifiers that are biased to at least partially offset the non-linearity of the main and peaking amplifiers of the Doherty amplifier. By providing these non-linear driver amplifiers, both the linearity and efficiency of a multi-path Doherty amplifier lineup can be improved. And consequently, by improving the raw linearity of the final-stage of the Doherty amplifier (that is, the main and peaking amplifiers), the DPD correction capabilities of the amplifier are enhanced and may allow for the use of a lower cost and less complex DPD correction method to achieve the desired linearity.

FIG. 1 shows an example Doherty amplifier lineup including a main and a peaking path, each driven by an input driver amplifier. In FIG. 1 as shown, a power splitter 101, such as an adjustable power splitter or radio frequency power splitter, is coupled to a main path 103 and a peaking path 105 of Doherty amplifier 100. The power splitter 101 is configured to divide an input signal 107 (e.g., RFIN) into multiple signals that are each transmitted along different amplification paths. Each amplification path may include a number of attenuators, phase shifters, and/or amplifiers. In FIG. 1, the power splitter 101 generates two output signals.

In one implementation, the power splitter 101 can include a power divider with an input for receiving an input radio frequency signal, and first and second divider outputs. When connected to a symmetrical Doherty amplifier, the power splitter 101 may divide or split an input signal received at the input 107 into two signals that are very similar with, in some embodiments, equal power. In other cases, though, the power splitter 101 may output unequal signals.

The outputs of the power splitter 101 are connected to driver amplifiers 109 and 111. Driver amplifiers 109 and 111 are configured to amplify the signals received from the power splitter 101. The driver amplifier 109 is connected to the main path 103 of the Doherty amplifier 100, while the driver amplifier 111 is connected to the peaking path 105 of the Doherty amplifier 100.

The Doherty amplifier 100 includes a main or carrier amplifier 113 coupled via a matching network or circuit (not illustrated) to an output of the driver amplifier 109 and a peaking amplifier 115 coupled via a matching network or circuit (not illustrated) to an output of the driver amplifier 111. As will be appreciated by those of ordinary skill based on the description herein, the main and peaking amplifiers 113 and 115 may be comprised of one or more stages of relatively low power level amplification and relatively high power level amplification.

The main amplifier 113 and the peaking amplifier 115 are coupled at power combiner 119. Line 117 includes an impedance inverter or a □/4 line phase shift element 117. The phase shift introduced by element 117 is, in some implementations, compensated by a 90 degree relative phase shift present on path 105 introduced by input splitter 101. Amplifier 100 is configured so that the main amplifier 113 provides the amplification for lower level signals, and both amplifiers 113 and 115 operate in combination to provide the amplification for high level signals. In one implementation, the main amplifier 113 is configured to amplify a signal received from the main path 103, while the peaking amplifier 115 is configured to amplify a signal received from the peaking path 105 only when the signal received from the peaking path 105 exceeds a predetermined threshold.

This may be accomplished, for example, by biasing the main amplifier 113, such that the amplifier 113 operates in a class AB mode, and biasing the peaking amplifier 115 such that the peaking amplifier 115 operates in a class C mode.

In many applications it is preferable that an amplifier be both efficient and have a linear response. In most amplifiers, though, there is a trade-off between the amplifier's efficiency and the amplifier's linearity. Accordingly, as the amplifier's efficiency increases, the amplifier's linearity decreases by a corresponding degree. Conventional Doherty amplifiers, though relatively efficient, are generally not sufficiently linear for wireless applications and often require correction. Specifically, the final stage of a Doherty amplifier lineup (that is, the combination of signals from the main amplifier 113 and peaking amplifier 115) do not have a sufficiently linear response. This is due to the nonlinear operation of the main and peaking amplifiers. The non-linearity can be expressed in terms of amplitude distortion (also referred to as compression or expansion) (AM-AM distortion) and phase distortion (AM-PM). As the power output by the amplifier increases, both the amplitude and phase distortion worsens.

In a conventional amplifier, the driver amplifiers (e.g., the driver amplifiers 109 and 111 of FIG. 1) are generally configured to have a linear response. The linear response of the driver amplifiers is selected in a conventional device to provide that the non-linearity of the main and peaking amplifiers are not further worsened by the use of non-linear driver amplifiers. As such, the non-linearity of the main and peaking amplifiers are generally reflected in the output of the conventional Doherty amplifier. To compensate for the non-linearity of the conventional Doherty amplifier, as discussed above, a number of techniques, such as DPD can be utilized.

Figure 2:
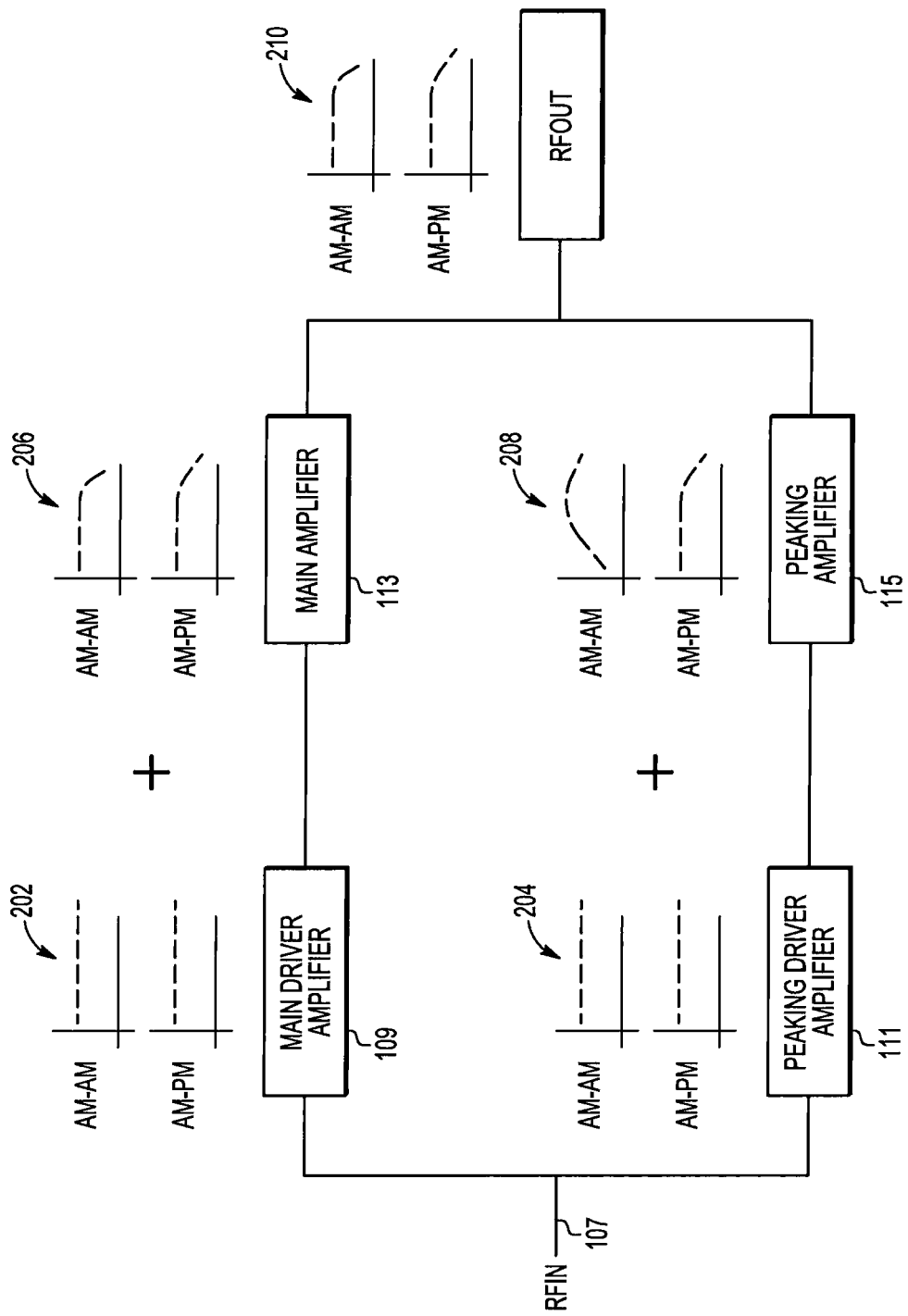
FIG. 2 is an illustration showing the non-linearity of several components of a Doherty amplifier lineup and how those components contributed to the non-linearity on the output of the amplifier.

To demonstrate the non-linearity of a conventional Doherty amplifier lineup, FIG. 2 is an illustration showing the non-linearity (or linearity) of several components of a conventional Doherty amplifier lineup and how those components contribute to the non-linearity on the output of the amplifier. FIG. 2 depicts the driver amplifiers 109 and 111, the main amplifier 113, the peaking amplifier 115, and the output of the amplifier of FIG. 1. Besides each component, a graph is provided depicting both the AM-AM distortion and AM-PM distortion (vertical axis) for each component versus power output (horizontal axis).

As described above, in a conventional amplifier, both the driver amplifiers 109 and 111 are configured to have linear responses. As shown in graphs 202 and 204, therefore, both the AM-AM distortion and AM-PM distortion are linear. In contrast to the driver amplifiers, both the main amplifier 113 and the peaking amplifier 115 do not have linear responses. As shown by graph 206, the main amplifier 113 experiences both amplitude and phase compression as the power output of the main amplifier 113 is increased. The peaking amplifier 115 experiences phase compression as the power output of the peaking amplifier 115 is increased, and experiences amplitude expansion-compression as the power output increases.

Because the driver amplifiers 109 and 111 have approximately linear responses, the linearity of the outputs from the main and peaking amplifiers 113 and 115 is generally controlled or determined by the attributes of those amplifiers— the driver amplifiers have little effect. Because neither the main amplifier 113 nor the peaking amplifier 115 has a linear response, the outputs of both the main and peaking paths of the amplifier are non-linear. Consequently, when the signals outputted by both the main amplifier 113 and the peaking amplifier 115 are combined at the amplifier output (e.g., by power combiner 119 depicted in FIG. 1), the output signal (e.g., RFOUT) of the amplifier is also non-linear, due to the non-linearity of the main and peaking amplifiers 113, 115. The non-linearity of the output signal is illustrated by graph 210, which depicts both AM-AM distortion and AM-PM distortion in the output signal.

Figure 3:
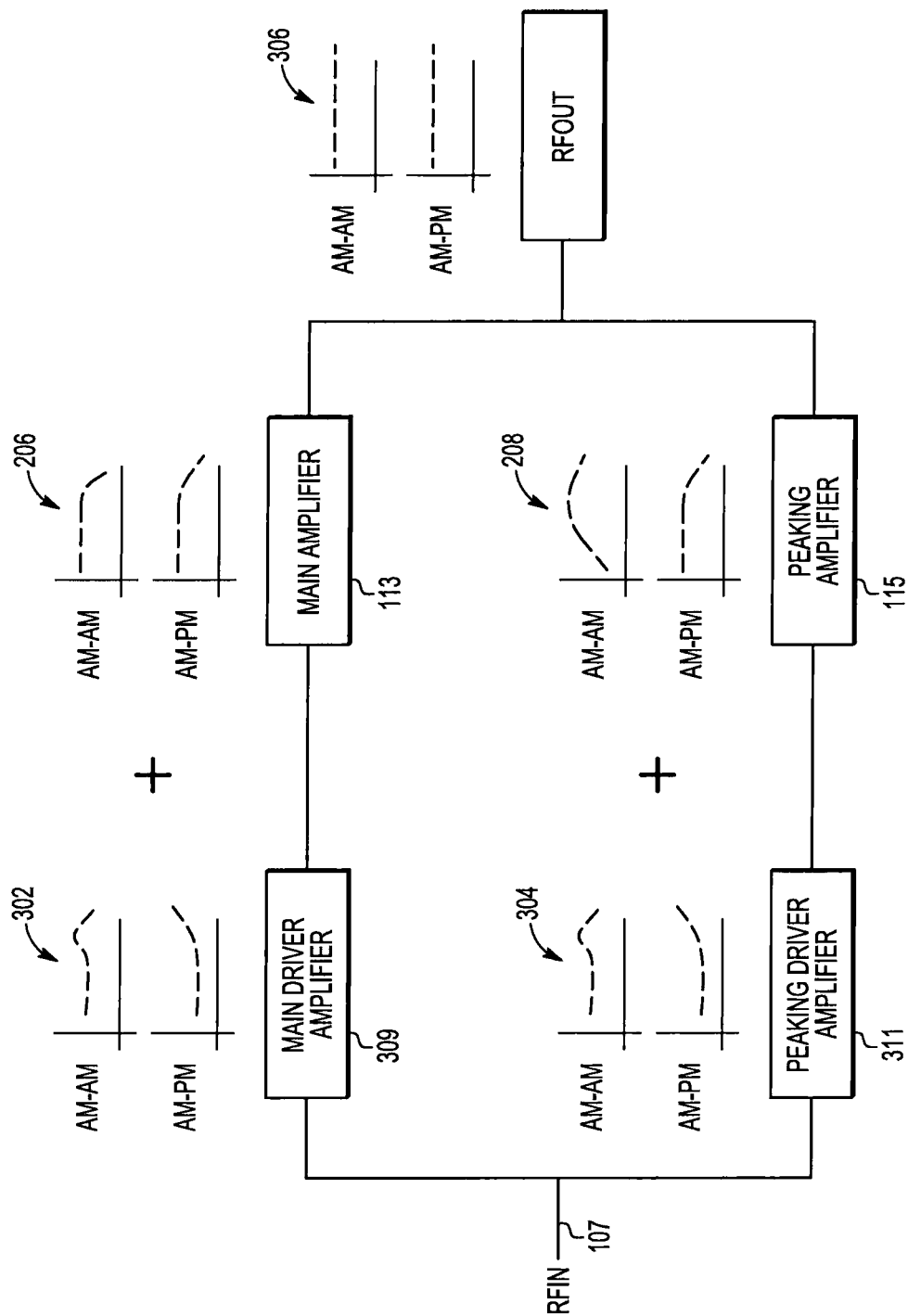
FIG. 3 is an illustration showing the non-linearity of the different components of an amplifier configured in accordance with the present disclosure.

In contrast to the conventional device described in FIG. 2, in the present system the driver amplifiers (e.g., the driver amplifiers 309 and 311) are configured to have non-linear responses that are selected or configured to offset the non-linear response of their corresponding main or peak amplifier. FIG. 3 is an illustration showing the non-linearity of the different components of an amplifier configured in accordance with the present disclosure.

As shown in FIG. 3, the driver amplifiers 309 and 311 are configured to have non-linear responses. The AM-AM distortion and AM-PM distortion of the driver amplifier 309 are depicted in graph 302, while the AM-AM distortion and AM-PM distortion of the driver amplifier 311 are depicted in graph 304. The responses of the main path amplifier 113 and the peaking path amplifier 115 may be unchanged from a conventional device, as depicted by graphs 206 and 208.

As depicted by graph 302, the driver amplifier 309 is configured to have a response that cancels the non-linearity of the main path amplifier 113. Similarly, as depicted by graph 304, the driver amplifier 311 is configured to have a response that cancels the non-linearity of the main path amplifier 115. This is achieved by selecting an appropriate bias point for both the driver amplifier 309 and the driver amplifier 311. In general, the bias point is selected such that the DC current drawn by the amplifier without an RF signal applied to the input is typically in the range of 3%-10% of the max DC current, depending on the particular transistor technology used in the main amplifier 113 and peaking amplifier 115. Specifically, both driver amplifiers are configured to have particular expansion-compression characteristics for both AM-AM distortion and AM-PM distortion that are the inverse of those characteristics in the main amplifier 113 and peaking amplifier 115. In such an arrangement, the distortions introduced by the new driver amplifiers 309 and 311 are offset by the inverse distortions in the main amplifier 113 and the peaking amplifier 115 resulting in output signals from the main amplifier 113 and the peaking amplifier 115 that may be more linear than in conventional amplifiers. Graph 306 of FIG. 3, for example, shows how the AM-AM and AM-PM distortion curves of the driver amplifiers 309 and 311 and the AM-AM and AM-PM distortion curves of the main amplifier 113 and the peaking amplifier 115 combine in the output of the amplifier device to generate a more linear output.

There are a number of techniques by which the distortion curves of the driver amplifiers can be selected to be the inverse of the distortion curves of the corresponding main or peaking amplifier. In one implementation, the driver amplifiers are biased to operate in deep class-AB mode (e.g., at 3-10% of maximum current drawn by the driver amplifiers at saturation). In that case, the driver amplifiers may also be configured to inhibit the transmission of second and third order harmonics, which can be generated by an amplifier operating in such a mode. The harmonics can be terminated using any suitable approach, including the utilization of short and open loads.

Figure 4:
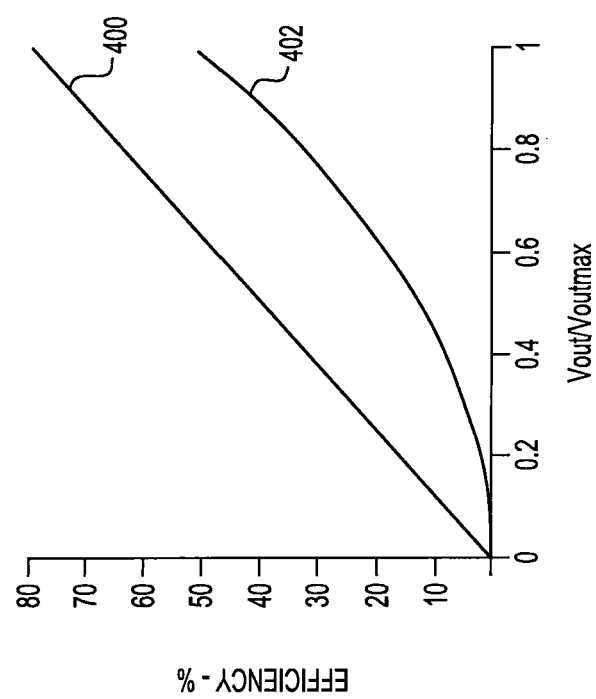
FIG. 4 is a graph depicting the efficiency of different classes of amplifiers versus the ratio of output voltage No) to maximum output voltage (Vom).

In addition to offsetting the non-linearity of the main and peaking amplifiers, the operation of the driver amplifiers in the deep class-AB mode (or, in some cases, even in as class B amplifiers) provides for more efficient operation of the driver amplifiers over conventional devices. FIG. 4 is a graph depicting the efficiency of different classes of amplifiers versus the ratio of output voltage (Vout) to maximum output voltage (Voutmax). In FIG. 4, line 400 depicts the efficiency curve for a class-B amplifier and line 402 depicts the efficiency curve for a class-A amplifier. As depicted, the class-A amplifier is not as efficient as the class-B amplifier. Under full drive conditions (i.e., where Vout=Voutmax), for example, the efficiency of the class-A amplifier is approximately 50%, while the efficiency for the class-B device is approximately 78.5%. A class A-B amplifier would exhibit an efficiency curve falling between the class A and class B curves depicted in FIG. 4, where the position and shape (curvature) of the efficiency curve for a class A-B amplifier would depend on how close the class A-B device was to either a class-A or class-B amplifier. In the case of a Doherty amplifier, a class A-B device would exhibit an efficiency curve laying closer to the class B curve shown on FIG. 4. A class C amplifier generally exhibits efficiencies that are higher than those observed in class-A or class-B devices, but with increased distortion.

Accordingly, in conventional Doherty amplifier lineups, where the driver amplifiers are driven in class-A so as to be near-linear, the driver amplifiers are not particularly efficient. In contrast, in an embodiment off the present invention, where the driver amplifiers are non-linear (and the non-linearity is selected to offset the non-linearities of the main and peaking amplifiers), the driver amplifiers can operate in different modes (e.g., class-AB, class-B or, in some cases, class-C), enabling the driver amplifier to be more efficient.

Figure 5A:
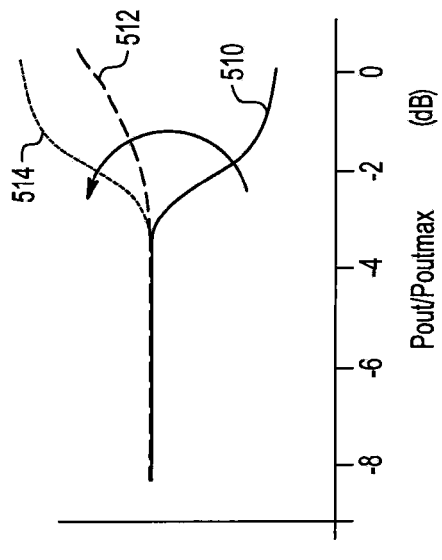
FIGS. 5A and 5B are graphs comparing the AM-AM and AM-PM distortion curves for different driver amplifiers.
Figure 5B:
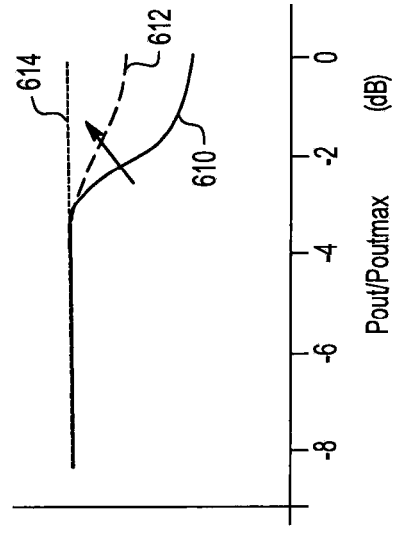

FIGS. 5A and 5B are graphs comparing the AM-AM and AM-PM distortion curves for different driver amplifiers. In FIG. 5A, the AM-AM distortion for a number of driver amplifiers versus the power output of the amplifier (Pout/Poutmax) are depicted. Curve 500 depicts the AM-AM distortion for a conventionally-configured driver amplifier. As illustrated, the curve is generally linear, but eventually, as power increases, the conventional driver exhibits AM-AM compression (this is a characteristics of all driver amplifiers as power increases). In contrast, curve 502 depicts the AM-AM distortion for a driver amplifier configured in accordance with the present disclosure. As illustrated, as power increases, curve 502 exhibits AM-AM expansion as compared to the conventional device. This expansion, as described above, is configured to offset the compression observed in the corresponding main or peaking amplifier in the Doherty lineup (e.g., the AM-AM expansion in the driver amplifier begins to occur at approximately the same ratio of Pout/Poutmax that AM-AM compression occurs in the main or peaking amplifier to which the driver amplifier is coupled, and the driver amplifier AM-AM expansion has a magnitude increase that is inversely proportional to the magnitude decrease of the main or peaking amplifier AM-AM compression). Finally, curve 504 depicts the AM-AM distortion that would be observed in an ideal driver amplifier, should such an amplifier be configured in accordance with the present disclosure. As depicted in FIG. 5A, therefore, the present disclosure contemplates configuring driver amplifiers in a Doherty amplifier lineup so as to achieve some degree of AM-AM expansion, where that expansion is configured to offset non-linearities present within the main and peaking amplifiers of such a lineup.

FIG. 5B depicts AM-PM distortion for a number of driver amplifiers versus the power output of the amplifier (Pout/Poutmax). Curve 510 depicts the AM-PM distortion for a conventionally-configured driver amplifier. As shown, the curve is generally linear, but, again, as power increases, the conventional driver exhibits AM-PM compression. In contrast, curve 512 depicts the AM-PM distortion for a driver amplifier configured in accordance with the present disclosure. As illustrated, as power increases, curve 512 exhibits AM-PM expansion as compared to the conventional driver amplifier. This expansion, as described above, is configured to offset the compression observed in the corresponding main or peaking amplifier in the Doherty lineup (e.g., the AM-PM expansion in the driver amplifier begins to occur at approximately the same ratio of Pout/Poutmax that AM-PM compression occurs in the main or peaking amplifier to which the driver amplifier is coupled, and the driver amplifier AM-PM expansion has a magnitude increase that is inversely proportional to the magnitude decrease of the main or peaking amplifier AM-PM compression). Finally, curve 514 depicts the AM-PM distortion that would be observed in an ideal driver amplifier, should such an amplifier be configured in accordance with the present disclosure. As depicted in FIG. 5B, therefore, the present disclosure contemplates configuring driver amplifiers in a Doherty amplifier lineup so as to achieve some degree of AM-PM expansion, where that expansion is configured to offset non-linearities present within the main and peaking amplifiers of such a lineup.

Figure 6A:
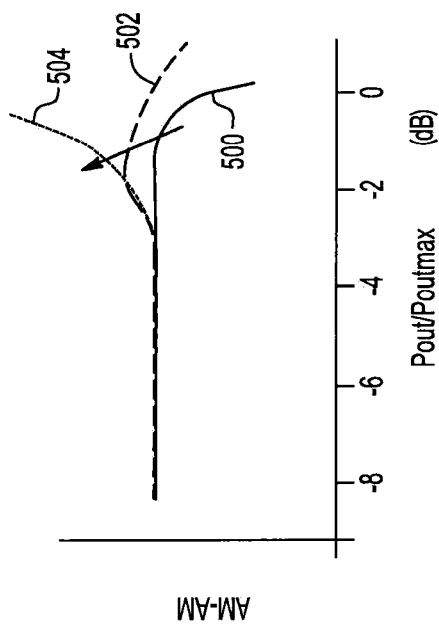
FIGS. 6A and 6B are graphs comparing the AM-AM and AM-PM distortion curves for different Doherty amplifier lineups.
Figure 6B:
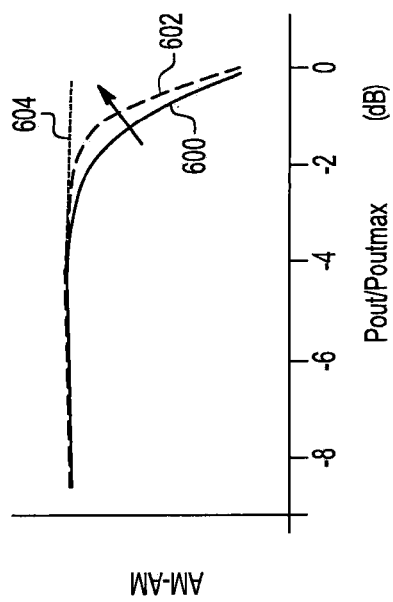

FIGS. 6A and 6B are graphs comparing the AM-AM and AM-PM distortion curves for different Doherty amplifier lineups. FIG. 6A depicts AM-PM distortion for a number of amplifiers versus the power output of the amplifier (Pout/Poutmax). Curve 600 depicts the AM-AM distortion for a Doherty amplifier lineup utilizing a conventionally-configured driver amplifier (e.g., a driver amplifier having an AM-AM distortion as illustrated by curve 500 in FIG. 5A). As illustrated, as power increases, the conventional Doherty amplifier lineup exhibits AM-AM compression.

In contrast, curve 602 depicts the AM-AM distortion for a Doherty amplifier lineup utilizing driver amplifiers configured in accordance with the present disclosure (e.g., a driver amplifier having an AM-AM distortion as illustrated by curve 502 in FIG. 5A). As illustrated, as power increases, curve 602 exhibits a reduced amount of AM-AM compression when compared to curve 600. As such, the linearity of the present Doherty amplifier lineup, as illustrated by curve 602, is improved.

Finally, curve 604 depicts the AM-AM distortion for a Doherty amplifier lineup utilizing ideal driver amplifiers configured in accordance with the present disclosure (e.g., a driver amplifier having an AM-AM distortion as illustrated by curve 504 in FIG. 5A). As illustrated, as power increases, curve 604 has no AM-AM compression or expansion and is, therefore, linear.

FIG. 6B depicts AM-PM distortion for a number of amplifiers versus the power output of the amplifier (Pout/Poutmax). Curve 610 depicts the AM-PM distortion for a Doherty amplifier lineup utilizing a conventionally-configured driver amplifier (e.g., a driver amplifier having an AM-AM distortion as illustrated by curve 510 in FIG. 5B). As illustrated, as power increases, the conventional Doherty amplifier lineup exhibits AM-PM compression.

In contrast, curve 612 depicts the AM-PM distortion for a Doherty amplifier lineup utilizing driver amplifiers configured in accordance with the present disclosure (e.g., a driver amplifier having an AM-PM distortion as illustrated by curve 512 in FIG. 5B). As illustrated, as power increases, curve 612 exhibits a reduced amount of AM-AM compression when compared to curve 610. As such, the linearity of the present Doherty amplifier lineup, as illustrated by curve 612, is improved.

Finally, curve 614 depicts the AM-PM distortion for a Doherty amplifier lineup utilizing ideal driver amplifiers configured in accordance with the present disclosure (e.g., a driver amplifier having an AM-PM distortion as illustrated by curve 514 in FIG. 5B). As illustrated, as power increases, curve 614 has no AM-PM compression or expansion and is, therefore, linear.

In one implementation, the desired driver amplifier performance is achieved by selecting appropriate semiconductor fabrication technologies for the amplifiers in conjunction with an appropriate bias point. The desired bias point will result in gain expansion-compression characteristics for AM-AM and AM-PM distortion that are the inverse of the distortion characteristics of the main and peaking amplifiers. In one implementation, the driver amplifiers are constructed utilizing Gallium Arsenide (GaAs) technology-based transistors (e.g., Indium Gallium Phosphide (InGaP) based Heterojunction Bipolar transistors (HBT) and/or GaAs Pseudomorphic High Electron Mobility Transistors (PHEMT)) biased at 3-10% of max current. This use of this form of transistors provides the further benefit that the technology is well suited to combining with the laterally diffused metal oxide semiconductor (LDMOS) construction used in the fabrication of the final stage (e.g., the main and peaking amplifiers) of Doherty-based base station amplifiers.

Figure 7:
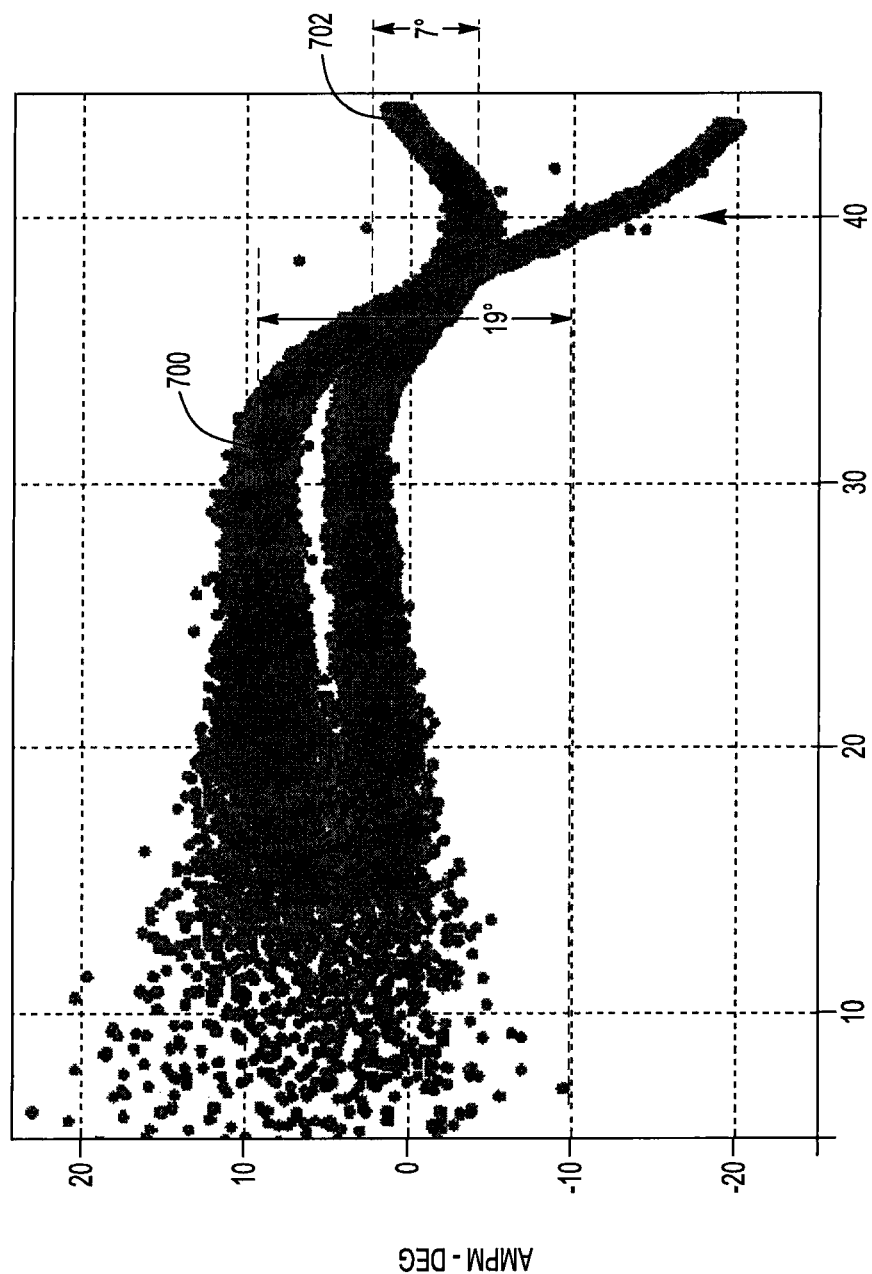
FIG. 7 is a chart depicting AM-PM distortion versus amplifier power.

To illustrate the potentially improved performance of the embodiments of Doherty amplifier lineups described herein, FIG. 7 is a chart depicting AM-PM distortion (vertical axis, in degrees) versus envelope power ratio (horizontal axis, in decibels referenced to one milliwatt (dBm)). Data set 700 depicts the AM-PM distortion for a conventionally-designed Doherty amplifier lineup having linear driver amplifiers. As illustrated by data set 700, the conventional amplifier experiences a significant amount of AM-PM compression as the power output of the amplifier increases.

Conversely, data set 702 depicts the AM-PM distortion for a Doherty amplifier lineup configured in accordance with an embodiment of the present disclosure and having driver amplifiers constructed using InGaP-based drivers. As illustrated by data set 702, embodiments of the present amplifier may experience a significantly reduced amount of AM-PM compression as the power output of the amplifier increases as compared to the conventional lineup. In tests, embodiments of the present Doherty amplifier lineup have been shown to have a reduced overall AM-PM variation of approximately 20 degrees when utilizing the InGaP-based drivers.

Because the Doherty-based amplifiers typically operate at back-off levels where compression characteristics are typically observed, the expansion characteristics in amplitude and phase of the driver stage would consequently linearize the output of main and peaking amplifiers. In other words, the inherent distortion generated by the main and peaking amplifiers is cancelled, thereby improving the overall raw linearity of the Doherty amplifier. Additionally, as the dual path driver stage amplifiers are biased in deep class-AB (or, in some cases, class B) region in some embodiments, the overall line up efficiency of the amplifier also may be enhanced. Similarly, by incorporating broadband Drivers, the overall bandwidth of the amplifier may also be improved.

Embodiments discussed in the present disclosure, therefore, may provide approaches for a more efficient and linear Doherty-based amplifier lineup. In contrast to conventional devices that utilize linear driver amplifiers, the present disclosure describes a Doherty-based amplifier utilizing non-linear driver amplifiers. The non-linearity of the driver amplifiers is configured to offset or negate the nonlinearity of the Doherty amplifier's main and peaking amplifiers. The non-linearity of the driver amplifiers not only may enhance the linearity of the entire amplifier device, but also may enable the driver amplifier to operate in more efficient amplifier classes, thereby potentially increasing the efficiency of the entire amplifier lineup.

Figure 8:
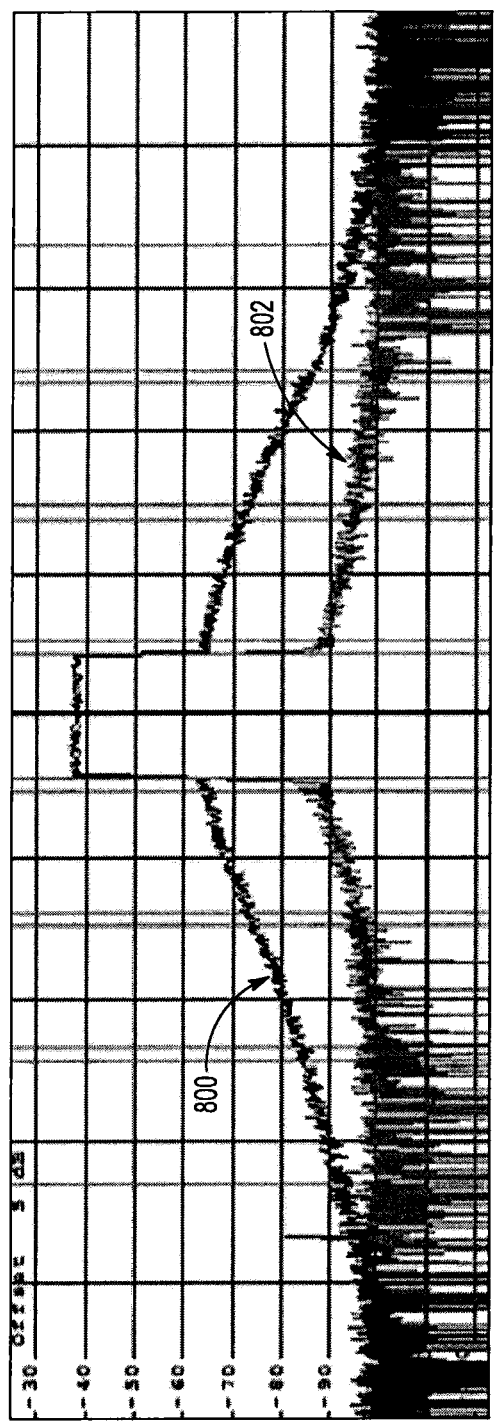
FIG. 8 is a chart depicting an example DPD for a conventional amplifier and an amplifier configured in accordance with the present disclosure.

Embodiments of the Doherty amplifier lineups described herein may additionally include some additional correction (e.g., DPD) as the various components making up the amplifier may not exhibit ideal performance. However, as illustrated by FIG. 8, an embodiment of a Doherty amplifier may perform a reduced amount of DPD to achieve a desired overall linearity of the Doherty amplifier lineup. In FIG. 8, line 800 depicts a DPD correction signal that may be employed in a conventional amplifier device that performs DPD. Line 802 depicts a DPD correction signal that may be employed in a Doherty amplifier lineup configured in accordance with an embodiment of the present disclosure that performs DPD. As illustrated, the DPD correction of the present amplifier is substantially reduced over that utilized for the conventional amplifier device.

An embodiment of a device includes a Doherty amplifier having a main path and a peaking path. The Doherty amplifier includes a main amplifier configured to amplify a signal received from the main path and a peaking amplifier configured to amplify a signal received from the peaking path when the signal received from the peaking path exceeds a predetermined threshold. The device includes a first driver amplifier connected to the main path of the Doherty amplifier. The first driver amplifier is configured to exhibit an amplitude and phase distortion characteristic that is an inverse of an amplitude and phase distortion characteristic of the main amplifier. The device includes a second driver amplifier connected to the peaking path of the Doherty amplifier. The second driver amplifier is configured to exhibit an amplitude and phase distortion characteristic that is an inverse of an amplitude and phase distortion characteristic of the peaking amplifier.

An embodiment of a device includes a first amplifier configured to amplify a signal received from a first path, a second amplifier configured to amplify a signal received from a second path, and a first driver amplifier connected to the first path. The first driver amplifier is configured to exhibit an amplitude and phase distortion characteristic that is an inverse of an amplitude and phase distortion characteristic of the first amplifier. The device includes a second driver amplifier connected to the second path. The second driver amplifier is configured to exhibit an amplitude and phase distortion characteristic that is an inverse of an amplitude and phase distortion characteristic of the second amplifier.

An embodiment of a method of operating an amplifier, the amplifier including a Doherty amplifier including a main amplifier configured to amplify a signal received from a main path and a peaking amplifier configured to amplify a signal received from a peaking path when the signal received from the peaking path exceeds a predetermined threshold, a first driver amplifier connected to the main path of the Doherty amplifier, and a second driver amplifier connected to the peaking path of the Doherty amplifier. The method includes operating the first driver amplifier as a class AB or class B amplifier to exhibit an amplitude and phase distortion characteristic that is an inverse of an amplitude and phase distortion characteristic of the main amplifier, and operating the second driver amplifier as a class AB or class B amplifier to exhibit an amplitude and phase distortion characteristic that is an inverse of an amplitude and phase distortion characteristic of the peaking amplifier.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A device, comprising:
    a Doherty amplifier having a main path and a peaking path, the Doherty amplifier including a main amplifier configured to amplify a signal received from the main path and a peaking amplifier configured to amplify a signal received from the peaking path when the signal received from the peaking path exceeds a predetermined threshold;
    a first driver amplifier connected to the main path of the Doherty amplifier, the first driver amplifier configured to exhibit an amplitude and phase distortion characteristic that is an inverse of an amplitude and phase distortion characteristic of the main amplifier; and
    a second driver amplifier connected to the peaking path of the Doherty amplifier, the second driver amplifier configured to exhibit an amplitude and phase distortion characteristic that is an inverse of an amplitude and phase distortion characteristic of the peaking amplifier.

2. The device of claim 1, wherein the first driver amplifier and the second driver amplifier include Gallium Arsenide transistors.

3. The device of claim 2, wherein the first driver amplifier and the second driver amplifier include Indium Gallium Phosphide (InGaP) based Heterojunction Bipolar transistors (HBT).

4. The device of claim 2, wherein the main amplifier and the peaking amplifier include laterally diffused metal oxide semiconductor transistors.

5. The device of claim 1, wherein the first driver amplifier or the second driver amplifier is a class AB amplifier.

6. The device of claim 1, wherein the first driver amplifier or the second driver amplifier is configured to inhibit the transmission of second order harmonics and third-order harmonics.

7. The device of claim 1, including a signal splitter configured to receive an input signal and output a first signal to the first driver amplifier and a second signal to the second driver amplifier.

8. The device of claim 1, wherein at least one of the first driver amplifier and the second driver amplifier is configured to operate at from 3% to 10% of a maximum current drawn by the at least one of the first driver amplifier and the second driver when operating at saturation.

9. A device, comprising:
    a first amplifier configured to amplify a signal received from a first path;
    a second amplifier configured to amplify a signal received from a second path;
    a first driver amplifier connected to the first path, the first driver amplifier configured to exhibit an amplitude and phase distortion characteristic that is an inverse of an amplitude and phase distortion characteristic of the first amplifier; and
    a second driver amplifier connected to the second path, the second driver amplifier configured to exhibit an amplitude and phase distortion characteristic that is an inverse of an amplitude and phase distortion characteristic of the second amplifier.

10. The device of claim 9, wherein the first driver amplifier and the second driver amplifier include Gallium Arsenide transistors.

11. The device of claim 10, wherein the first driver amplifier and the second driver amplifier include Indium Gallium Phosphide (InGaP) based Heterojunction Bipolar transistors (HBT).

12. The device of claim 10, wherein the first amplifier and the second amplifier include laterally diffused metal oxide semiconductor transistors.

13. The device of claim 9, wherein the first driver amplifier or the second driver amplifier is a class AB amplifier.

14. The device of claim 9, wherein the first driver amplifier or the second driver amplifier is configured to inhibit the transmission of second order harmonics and third-order harmonics.

15. The device of claim 9, including a signal splitter configured to receive an input signal and output a first signal to the first path and a second signal to the second path.

16. The device of claim 9, wherein at least one of the first driver amplifier and the second driver amplifier is configured to operate at from 3% to 10% of a maximum current drawn by the at least one of the first driver amplifier and the second driver at a saturation condition.

17. A method of operating an amplifier, the amplifier including a Doherty amplifier including a main amplifier configured to amplify a signal received from a main path and a peaking amplifier configured to amplify a signal received from a peaking path when the signal received from the peaking path exceeds a predetermined threshold, a first driver amplifier connected to the main path of the Doherty amplifier, and a second driver amplifier connected to the peaking path of the Doherty amplifier, the method comprising:
    operating the first driver amplifier as a class AB or class B amplifier to exhibit an amplitude and phase distortion characteristic that is an inverse of an amplitude and phase distortion characteristic of the main amplifier; and
    operating the second driver amplifier as a class AB or class B amplifier to exhibit an amplitude and phase distortion characteristic that is an inverse of an amplitude and phase distortion characteristic of the peaking amplifier.

18. The method of claim 17, including applying digital predistortion to an input signal to the amplifier.

19. The method of claim 17, wherein operating the first driver amplifier includes, when the main amplifier exhibits an amplitude or phase compression, operating the first driver amplifier to exhibit an amplitude or phase expansion configured to offset the amplitude or phase compression of the main amplifier.

20. The method of claim 17, wherein operating the second driver amplifier includes, when the peaking amplifier exhibits amplitude or phase compression, operating the second driver amplifier to exhibit amplitude or phase expansion configured to offset the amplitude or phase compression of the peaking amplifier.

* * * * *